United States Patent
Coley et al.

(10) Patent No.: US 6,184,882 B1
(45) Date of Patent: Feb. 6, 2001

(54) METHOD AND APPARATUS FOR OPERATIONAL CONTROL OF A RADIO COMMUNICATION SYSTEM

(76) Inventors: Casey Stuart Alan Coley, 52 Clayton Crescent, Bowmanville, Ontario (CA), L1C 4N8; William Lawrence Foster, 150 Graydon Hall Drive, Don Mills, Ontario (CA), M3A 3B1; Arthur L. Fumarolo, 1201 Champlaine Ct., Schaumburg, IL (US) 60193

( * ) Notice: Under 35 U.S.C. 154(b), the term of this patent shall be extended for 0 days.

(21) Appl. No.: 08/415,911

(22) Filed: Apr. 3, 1995

(51) Int. Cl.[7] .............................. G09G 5/00; G06F 13/00; G06F 3/00
(52) U.S. Cl. .................... 345/345; 345/340; 345/342; 345/970; 345/113
(58) Field of Search .................. 379/96, 93.17; 455/89, 158.5, 62; 395/156, 157, 159; 345/119, 120, 133, 130, 902, 113, 340, 357, 343, 331, 344, 345, 352, 332, 353, 970, 342; 340/825.69

(56) References Cited

U.S. PATENT DOCUMENTS

| | | | |
|---|---|---|---|
| 4,961,070 | 10/1990 | Maher et al. | 345/119 |
| 5,140,678 * | 8/1992 | Torres | 395/159 |
| 5,152,011 * | 9/1992 | Schwob | 455/158.5 |
| 5,367,624 | 11/1994 | Cooper | 395/157 |
| 5,425,051 * | 6/1995 | Mahany | 455/62 |

* cited by examiner

Primary Examiner—Lun-Yi Lao
(74) Attorney, Agent, or Firm—Andrew S. Fuller

(57) ABSTRACT

A radio communication system (100) has an information display interface (201) to provide operator assisted operational control. The information display interface (201) has multiple control sheets (240, 250) each containing an operator configurable category of radio system control information. A particular control panel (263) for controlling a particular portion of the radio communication system is co-located on multiple control sheets (240, 250). One of the control sheets (240) is made active and displayed in a foreground display mode. Operational control of the particular portion of the radio communication system (100) is conducted through the particular control panel (263) on the active control sheet (240).

14 Claims, 4 Drawing Sheets

METHOD AND APPARATUS FOR OPERATIONAL CONTROL OF A RADIO COMMUNICATION SYSTEM

CROSS REFERENCE TO RELATED APPLICATIONS

This application is related to copending U.S. patent application Ser. No. 08/415,977 (not received yet) entitled METHOD AND APPARATUS FOR A RADIO COMMUNICATION SYSTEM CONTROL INTERFACE, Docket No.: CM02569H—Fumarolo, et al and assigned to Motorola, Inc.

TECHNICAL FIELD

This invention relates in general to operator control interfaces, and more particularly, to operator control interfaces for a radio communication system.

BACKGROUND OF THE INVENTION

Modern radio communication systems can be very complex. Many systems include numerous channels and other communication resources that must be monitored and controlled by one or more operators. As radio communication systems grow in size and complexity, the ability of a controlling operator, such as a dispatcher, to manage and control a communication system becomes increasingly difficult. In a typical prior art radio communication system, a dispatcher is provided with a console, such as a cathode ray tube (CRT) display console, that allows channel control windows to be accessed, and for system operations control commands to be executed via selections on the console.

With the large quantity of information to be displayed to the operator, the console, which is of fixed dimensions, may not have sufficient display area necessary to present all the options and/or information necessary for the operator. Consequently, the operator may have to scroll pages of information in order to access the desired control information. Additionally, the information and control elements on the display console may not be efficiently presented for a given situation. The organization of console information may differ depending on the situations at hand, by the time of day that the system is operating, by the experience level of the operator among others. Generally, today's console presentations are either fixed, or when configurable, requires substantial effort for reconfiguration.

A need exists for a radio console display that can conveniently accommodate a large number of communication resources, such as channels, options, and control, for the effective management of complex communication system. Such console display should be easily configurable to fit the needs of a particular user or situation. Yet, an operator should not be allowed to reconfigure the system in such a way as to hamper effective control of the radio communication system.

DETAILED DESCRIPTION OF THE PREFERRED EMBODIMENT

Figure 1:
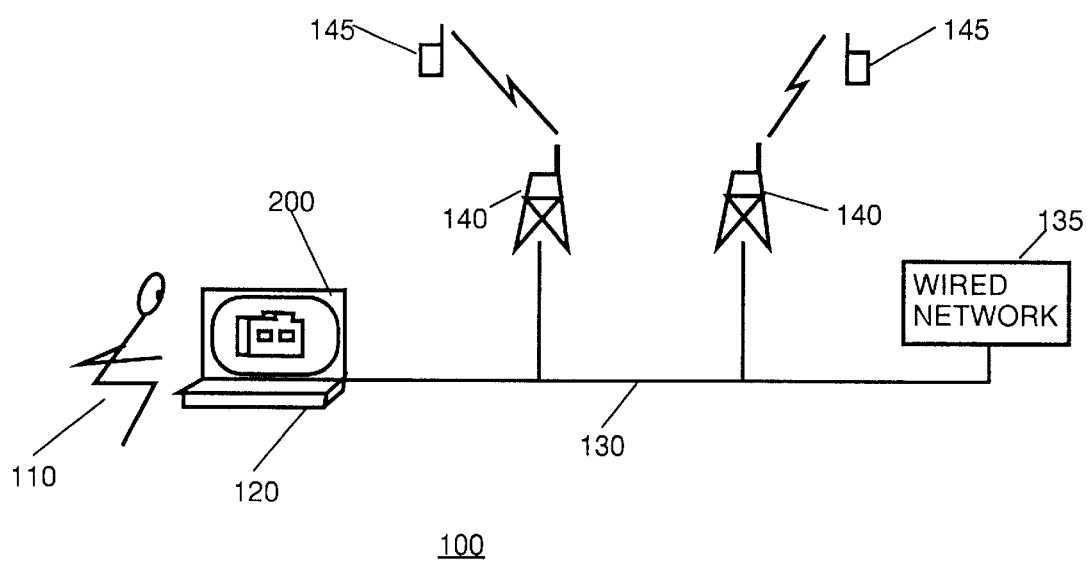
FIG. 1 shows a radio communication system with a operational control interface, in accordance with the present invention.

While the specification concludes with claims defining the features of the invention that are regarded as novel, it is believed that the invention will be better understood from a consideration of the following description in conjunction with the drawing figures, in which like reference numerals are carried forward.

Generally, the present invention provides for a radio communication system having a user interface to support operator assisted operational control of the radio communication system. The operational control user interface includes a display unit, having an information display interface through which radio system operations and other functions are performed. For radio communication system control, the information display interface includes multiple control or display sheets, i.e., predefined display areas or windows that are individually selectable. The control sheets are activated depending on the category of controls on a particular control sheet, and the system control needs of the operator. Each sheet contains one or more radio system control panels, typically related to a specific portion of the radio communication system. According to the present invention, the information display interface has a particular control panel that is accessible from two or more control sheets. In one embodiment, the particular control panel has a different level of detail, or different set of features, depending upon the control sheet from which it is accessed. Operational control of at least a portion of the radio communication system is conducted through one or more radio system control panels that includes the particular control panel.

Referring to FIG. 1, a depiction of a radio communication system 100 is shown in accordance with the present invention. The communication system 100 includes a number of wireless transceivers or communicators 140 which are linked together via a communication network 130. These transceivers 140 interface with remotely situated wireless communication devices 145. The communication network 130 is also coupled to a wired network 135 to provide a telephone line interface and other network interfaces. A computer 120 is coupled to the communication network 130 to provide overall operational control over the radio communication system 100 or a portion thereof. An operator 110 is presented with control information from the control computer 120 through an information display interface 201 implemented via a display unit 200 connected to the computer 120. The operator interfaces with the computer 120 via well-known input devices such as a keyboard, a mouse or other pointing device, and the display unit 200. In the preferred embodiment, the computer 120 is a personal computer (PC) class computing device. However, the present invention is not limited to a specific computing device and may be implemented on any computing device which provides an information display unit which may be accessed by an operator.

Figure 2:
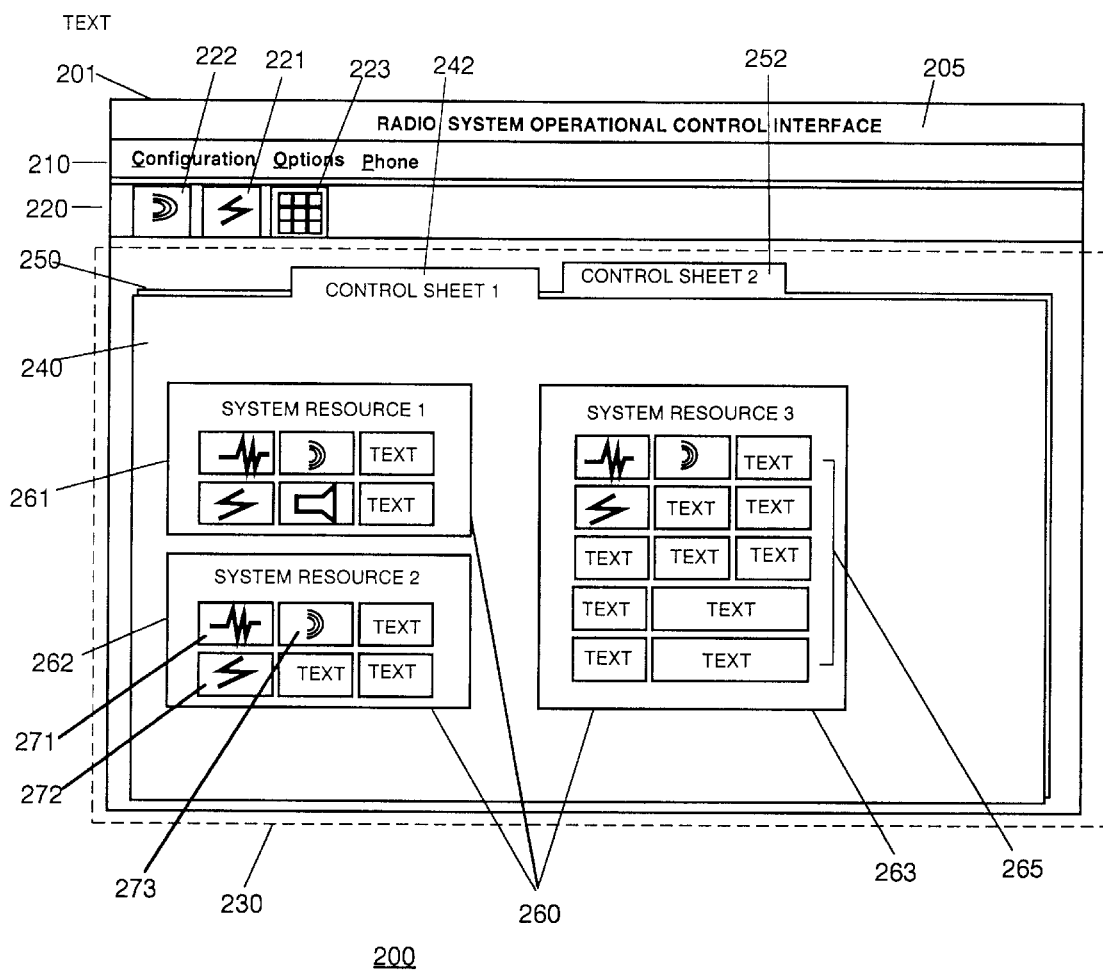
FIG. 2 shows an information display interface having an active control sheet for controlling a subset of radio communication system operations, in accordance with the present invention.

FIG. 2 shows the display unit 200 incorporating an information display interface 201, in accordance with the present invention. Referring to FIGS. 1 and 2, the information display interface 201 is implemented using a graphical user interface (GUI), or "windowing" operating environment, in which user selections are facilitated by using a pointing device. Such GUI operating systems are quite common in the art. Examples include the Microsoft® Windows Operating System, the Apple Macintosh® Operating System, the UNIX-based X-Windows user interface, among others. Typically, an item on the GUI is "selected" by manipulating a pointing device which controls a cursor, or other indicator on the display unit. A user application program typically allows a user to select an area on the display unit, which may be represented by an icon to invoke an operation by "clicking" or "double-clicking" the area on the display unit indicated by the cursor. Another feature commonly found with GUIs are "pull-down" or "pop-up" menus. A pull-down or pop-up menu is generally activated by engaging a selector switch of the input pointing device when the cursor represented on the display unit is at a particular location, such as by being over an icon or text. The input device and cursor are also used to manipulate graphical objects on the display unit such as by moving, activating, or other manipulations of these graphical objects. Many modern GUIs allow representations such as buttons with iconic depiction, scroll bars, and window manipulation control objects. One skilled in the art would appreciate that these features can be implemented using object libraries and system calls commonly found in application tool kits available for the respective graphical user interfaces and associated operating systems.

In the preferred embodiment, the information display interface 201 is implemented to operate under the Microsoft® Windows Operating System. The control panels, control sheets, and other concepts embodied in the present invention can be implemented in the C++ software language using graphical and other functional library objects available for use with the Microsoft® C++ compiler. For example, certain GUI features are used, such as pull-down or pop-up menus, selectable objects, and features for the manipulation of graphical objects on a display unit, among others. The information display interface 201 executes as a process or task within a multi-task software application that provides operational control of a radio communication system. Other tasks or processes communicate with the information display interface to provide links to communication hardware, and for other functions.

In the preferred embodiment, the information display interface 201 includes a pull-down menu area 210, a toolbar 220, a control sheet display area 230 having control sheets 240, 250 displayed therein, and a logo and system information display area 205. Additionally, the information display interface 201 has provisions (not shown) for accommodating auxiliary functions represented by graphical objects which can be selectively located thereon. The pull-down menu area 210 includes selectable menus for configuration, options, and such other application related functions which are globally applicable, commonly referenced, or otherwise useful to be contained in this area. The content of the toolbar 220 is user definable and may include commonly invoked activities which are preferably available at the touch of a button. Accordingly, the toolbar 220 shown in the preferred embodiment has a transmit button 221, a muting button 222, a keypad activation button 223, among other possibilities. While some radio system control functions may be accessible through the menu area 210, or the toolbar 220, a significant aspect of the present invention involves the use of two or more control sheets 240, 250 and the interaction between the control sheets 240, 250 and other options available on the information display interface 201 to effectively perform radio system control operations.

In the preferred embodiment, the control sheets 240, 250 formed on the information display interface 201 are automatically arranged on the display unit 200 to allow at least some of the control sheets 240, 250 to overlap while ensuring that none of the control sheets totally occludes or covers a selectable portion corresponding to another control sheet. Preferably each control sheet 240, 250 is shaped like a folder, and each control sheet has a selectable portion 242, 252 in the form of a tab extending from the control sheet 240, 250. The tabs 242, 252 are arranged on the display area in a stacked arrangement. Thus, even though a large portion of a control sheet may be covered by another control sheet, the tab of the control sheet is automatically positioned so that it is not covered by any other element while the information display interface 201 is active on the display unit 200. Preferably, each control sheet 240, 250 contains an operator configurable category of radio system control information. Generally, the tabs 242, 252 contain identification information, such as text or symbols, that correspond to the category for the control sheet 240, 250. A control sheet 240, 250 is selectively active and may be activated by selecting the tab 242, 252 corresponding to that control sheet. When activated, the control sheet is automatically displayed in a foreground display mode.

The information display interface 201 shown in FIG. 2, depicts an activated control sheet 240 selected from the available control sheets 240, 250 and displayed in the foreground display mode. The activated control sheet 240 has control panels, such as radio system control panels 260, displayed or located thereon. Generally, a control panel is an area on the information display interface, preferably contained within defined borders, that includes a set of features 265 represented by text or graphical objects, such as symbols or icons. Preferably, the set of features also includes manipulable elements, such as buttons, graphically depicted feature controls, and/or selectable areas for invoking a specific function. Operational control of at least a portion of the radio communication system is conducted through one or more radio system control panels of an activated control sheet. Although radio system control panels are depicted in preferred embodiment, other system resource control or auxiliary functions can also be conducted through an appropriately configured control panel while employing concepts of the present invention. Thus, peripheral control functions may exist for telephone, networking, security, and other diverse applications.

The control panels may be defined to have various levels of detail, or sets of features, and consequently may vary in size. For example, two control panels 261, 262, corresponding to SYSTEM RESOURCE 1 and SYSTEM RESOURCE 2 on the activated control sheet 240, have a particular level of detail or set of features different from that of a third control panel 263 of the control sheet 240 corresponding to SYSTEM RESOURCE 3. A control panel is formed to have a number of features which are ordinarily represented by buttons or other graphical objects having icons, symbols, and/or text, to indicate the function of the object. In the preferred embodiment, each radio system control panel has an icon 273 representing a communication signal, an icon 272 representing a communication command, and an area having a real-time notifier 271. Typically, the communication signals 272 are indicators for an incoming message or for communication activity on a communication channel; the communication commands 272 are transmit or broadcast directives, or the like; and the real-time notifiers 271 display an alert for a current activity, and may include indicators for communication signals, alarm conditions, and the like. A real-time notifier may be represented by icons, buttons, text, or other visual indicators.

Figure 3:
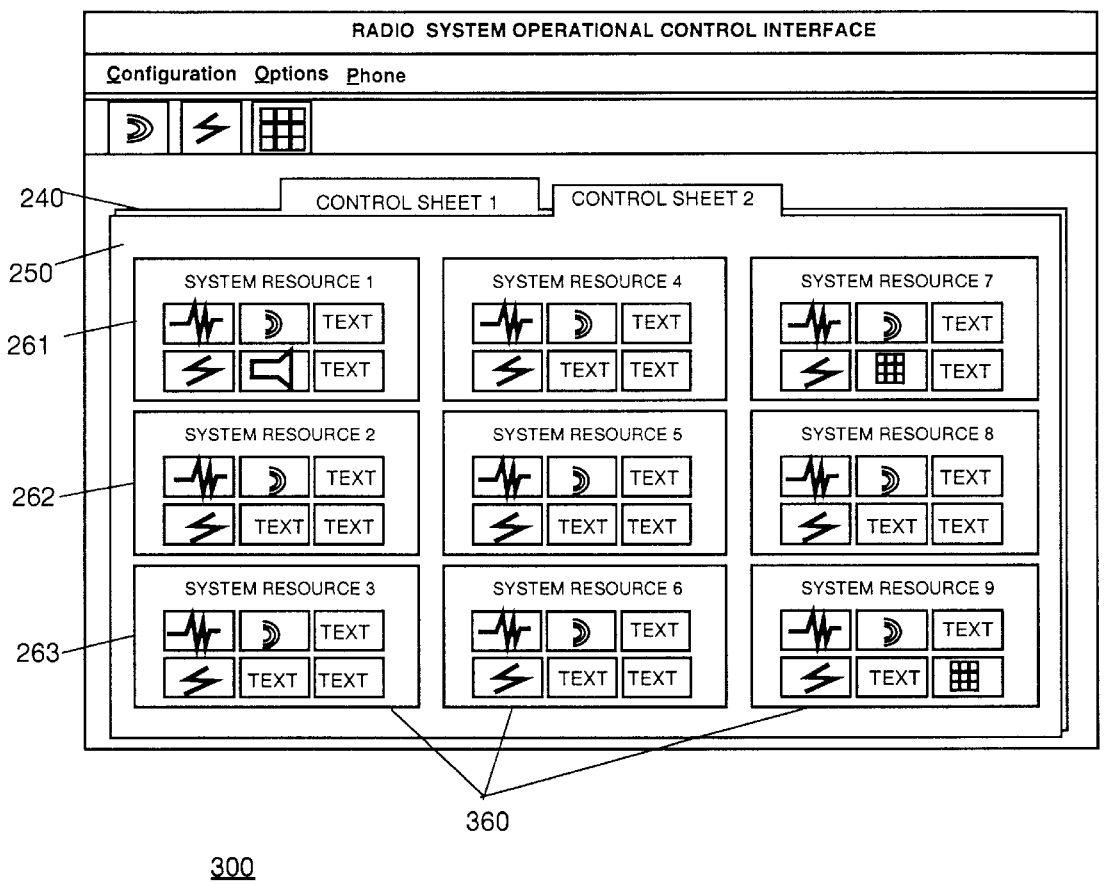
FIG. 3 shows the information display interface of FIG. 2 having a second active control sheet, in accordance with the present invention.

In FIG. 3, another control sheet 250 with a different configuration of radio control panels 360 is shown, in accordance with the present invention. Here, the radio system control panels 360 are defined to occupy the minimum permissible space on the control sheet 250. Thus, the number of system control panels 360 that can be displayed on the control sheets is maximized. The ability to locate a particular control panel on multiple control sheets is a significant aspect of the present invention. Referring to FIGS. 2 and 3, there is shown three radio system control panels 261, 262, 263 that are contemporaneously located on both control sheets 240, 250, so as to be accessible from each control sheet when active. Two of the control panels 261, 262 have the same level of detail, or the same configuration, on either of the control sheets. A third control panel 263 controls a particular portion of the radio communication system and represents a communication channel. The third control panel 263 has a different level of detail, i.e., an expanded feature set, when accessed from on the control sheet 250, than when accessed from the control sheet 240. The feature set displayed on a given control sheet will depend on the intended function of the control panel on that control sheet. This feature set is configurable by a user from a configuration tool. The ability to represent a particular control panel in multiple levels of detail, or in multiple configurations, is a significant aspect of the present invention.

Figure 4:
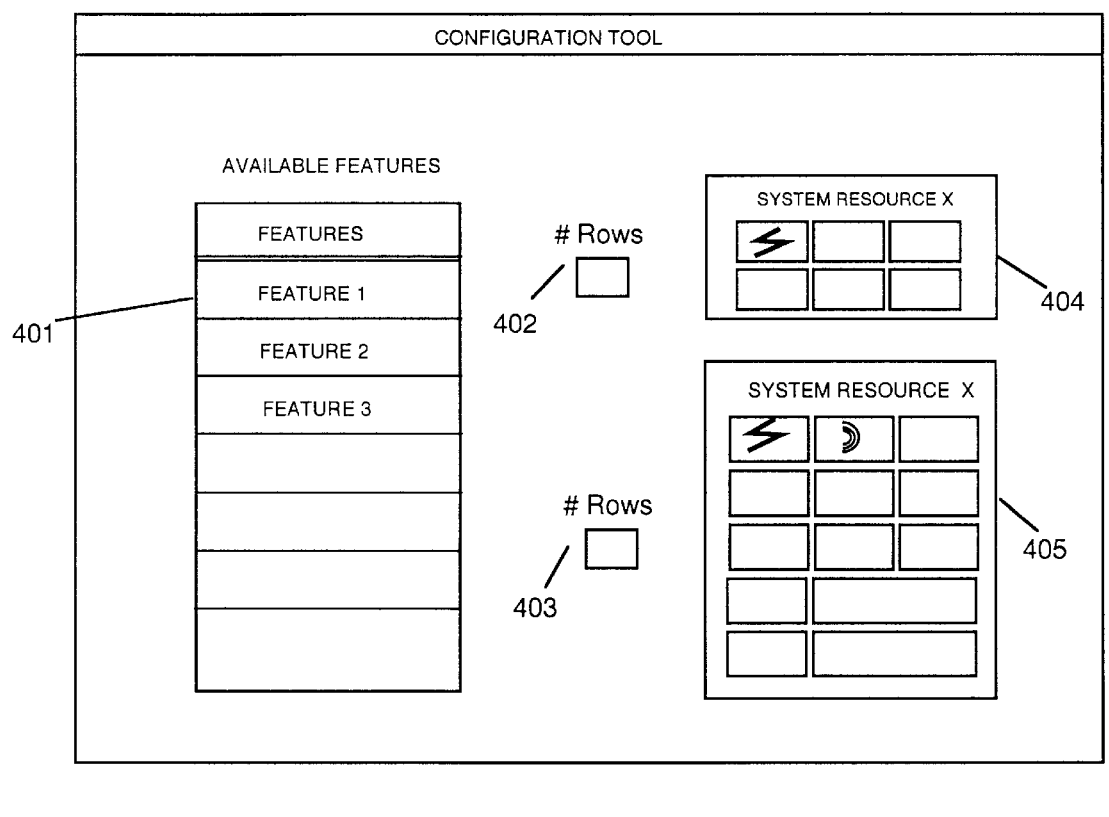
FIG. 4 shows a configuration tool operating on the information display interface to define a radio system control panel in accordance with the present invention.

The information display interface also includes a configuration tool. The configuration tool is operable on the information display interface to define content for a new control sheet or to modify an existing control sheet. Generally, the content for the control sheet is defined using one or more related radio system control panels as previously described. FIG. 4 shows a configuration tool 400 with definition options for a radio system control panel. The configuration tool 400 allows a configuration operator to designate which feature, from a feature list 401, appears on a radio system control panel and how that feature is to be represented. The level of detail or feature set 404, 405 and a corresponding number of rows 402, 403 are also definable. Other options (not shown) enable the user to define relative location of the control panel on the control sheet, and to assign such specifics as the category name for the control sheet. Editing functions are included for user manipulation. Such editing functions are common in the art and no further explanation is provided. The configuration tool also allows categorization of the control panels, i.e., which control panels appear on which control sheet.

In summary, the present invention provides for a radio communication system having a information display interface for providing operator assisted operational control of a radio communication system. The information display interface provides for an organization of information on a display unit to enhance the efficiency and ease with which an operator can effectively control the radio communication system. A particular control panel on the control sheet may be accessed from multiple control sheets, organized by category, to provide the operator with quick access to important controls, or to provide the operator with different views of the system. The organization and presentation of important control information is critical to the efficient operation of a radio communication system. Accordingly, unlike prior art systems, the present invention provides for the inclusion of the same control panel in different categories as represented by the various control sheets. A control panel may differ in level of detail, or differ in feature set, on different control sheets. Prior art systems also require the scrolling or paging of displays in order to access different portions of large radio communication systems. As a result, there is a potential that activity within a particular portion of the communication system might be inadvertently missed because such information is not readily presented to the operator. The information display interface of the present invention provides for an organization of information and controls to alleviate such situations.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. In a radio communication system having an information display interface to provide operator assisted operational control of the radio communication system, a method comprising the steps of:

forming first and second control sheets for selective activation on a display area of the information display interface such that the first and second control sheet represent operator configurable categories of radio system control information;

locating, on the first control sheet, a control panel for controlling a particular portion of the radio communication system;

locating the control panel on the second control sheet;

activating a selected control sheet from the first and second control sheets;

displaying the selected control sheet in a foreground display mode; and performing operational control of the particular portion of the radio communication system through the control panel of the selected control sheet.

2. The method of claim 1, wherein the step of forming first and second control sheets comprises the steps of:

forming the control panel to have a first level of detail when displayed on the first control sheet; and forming the control panel to have a second level of detail, different from the first level of detail, when the control panel is displayed on the second control sheet.

3. The method of claim 1, wherein the step of forming first and second control sheets comprises the steps of:

forming the control panel to have a first set of features when displayed on the first control sheet; and forming the control panel to have a second set of features, different from the first set of features when the control panel is displayed on the second control sheet.

4. The method of claim 3, wherein the step of forming first and second control sheets further comprises the step of forming the control panel to represent at least one communication channel.

5. The method of claim 4, wherein the step of forming first and second control sheets further comprises the step of forming the control panel to have an icon representing a communication command.

6. The method of claim 4, wherein the step of forming first and second control sheets further comprises the step of forming the control panel to have an icon representing a communication signal.

7. The method of claim 4, wherein the step of forming first and second control sheets further comprises the step of forming the control panel to have a real-time notifier.

8. An apparatus for providing operator assisted operational control of a radio communication system, comprising:

a communication network;

a computer coupled to the communication network, the computer having a display unit;

an information display interface displayed on the display unit;

first and second control sheets being selectively active on the information display interface, the first and second control sheets each having radio system control information thereon pertaining to a configurable category, including a radio system control panel for controlling a particular portion of the radio communication system that is contemporaneously located on both the first and second control sheets; and an activated control sheet, selected from among the first and second control sheets, and displayed in a foreground display mode;

wherein operational control of the particular portion of the radio communication system is conducted through the radio system control panel as displayed on the activated control sheet.

9. The apparatus of claim 8, wherein:

the radio system control panel has a first set of features when displayed on the first control sheet; and the radio system control panel has a second set of features, different from the first set of features, when the radio system control panel is displayed on the second control sheet.

10. The apparatus of claim 8, wherein:

the radio system control panel has a first level of detail when displayed on the first control sheet; and the radio system control panel has a second level of detail, different from the first level of detail, when the radio system control panel is displayed on the second control sheet.

11. The apparatus of claim 10, wherein the radio system control panel has controls for at least one communication channel.

12. The apparatus of claim 10, wherein the radio system control panel has an icon representing a communication command.

13. The apparatus of claim 10, wherein the radio system control panel has an icon representing a communication signal.

14. The apparatus of claim 10, wherein the radio system control panel has a real-time notifier.

* * * * *